(12) United States Patent
Hashizume et al.

(10) Patent No.: US 10,950,527 B2
(45) Date of Patent: Mar. 16, 2021

(54) SEMICONDUCTOR DEVICE AND METHOD FOR MANUFACTURING THE SAME

(71) Applicant: RENESAS ELECTRONICS CORPORATION, Tokyo (JP)

(72) Inventors: Shoji Hashizume, Tokyo (JP); Yasushi Takahashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/291,872

(22) Filed: Mar. 4, 2019

(65) Prior Publication Data
US 2019/0311974 A1 Oct. 10, 2019

(30) Foreign Application Priority Data
Apr. 5, 2018 (JP) ............................... JP2018-073311

(51) Int. Cl.
| | | |
|---|---|---|
| H01L 23/495 | (2006.01) | |
| H01L 23/00 | (2006.01) | |
| H01L 21/48 | (2006.01) | |
| H01L 23/31 | (2006.01) | |
| B23K 35/26 | (2006.01) | |
| H01L 21/56 | (2006.01) | |

(52) U.S. Cl.
CPC .... *H01L 23/49513* (2013.01); *H01L 21/4842* (2013.01); *H01L 23/3121* (2013.01); *H01L 23/49562* (2013.01); *H01L 23/49568* (2013.01); *H01L 24/27* (2013.01); *H01L 24/32* (2013.01); *H01L 24/48* (2013.01); *H01L 24/73* (2013.01); *H01L 24/83* (2013.01); *B23K 35/262* (2013.01); *H01L 21/565* (2013.01); *H01L 24/49* (2013.01); *H01L 24/85* (2013.01); *H01L 24/92* (2013.01); *H01L 2224/29111* (2013.01); *H01L 2224/29116* (2013.01); *H01L 2224/29139* (2013.01); *H01L 2224/29147* (2013.01); *H01L 2224/4903* (2013.01); *H01L 2224/73265* (2013.01); *H01L 2224/83047* (2013.01); *H01L 2224/83048* (2013.01); *H01L 2224/83192* (2013.01); *H01L 2224/83815* (2013.01); *H01L 2224/92247* (2013.01); *H01L 2924/014* (2013.01); *H01L 2924/13055* (2013.01); *H01L 2924/13091* (2013.01); *H01L 2924/35121* (2013.01)

(58) Field of Classification Search
None
See application file for complete search history.

(56) References Cited

U.S. PATENT DOCUMENTS

| | | | | |
|---|---|---|---|---|
| 8,994,159 | B2 * | 3/2015 | Nakamura | ........ H01L 23/49541 257/676 |
| 9,583,455 | B2 * | 2/2017 | Oyachi | ............. H01L 23/49855 |
| 2018/0096919 | A1 * | 4/2018 | Roth | ................. H01L 23/49558 |
| 2019/0311974 | A1 * | 10/2019 | Hashizume | ......... H01L 21/4842 |

FOREIGN PATENT DOCUMENTS

JP     2009-152226 A     7/2009

* cited by examiner

*Primary Examiner* — Long Pham
(74) *Attorney, Agent, or Firm* — McDermott Will & Emery LLP

(57) ABSTRACT

A chip mounting portion included in a semiconductor device has a region including a semiconductor chip in plan view. When an average surface roughness of the region is "Ra", 0.8 μm≤Ra≤3.0 μm holds.

8 Claims, 13 Drawing Sheets

SEMICONDUCTOR DEVICE AND METHOD FOR MANUFACTURING THE SAME

CROSS-REFERENCE TO RELATED APPLICATION

The present application claims priority from Japanese Patent Application No. 2018-073311 filed on Apr. 5, 2018, the content of which is hereby incorporated by reference into this application.

TECHNICAL FIELD OF THE INVENTION

The present invention relates to a semiconductor device and a technique for manufacturing the semiconductor device, for example, a technique effectively applied to a semiconductor device that includes a semiconductor chip mounted on a chip mounting portion via solder.

BACKGROUND OF THE INVENTION

Japanese Unexamined Patent Application Publication No. 2009-152226 (Patent Document 1) describes a technique for improving adhesion between a lead frame and a sealing resin by increasing accuracy in controlling wet-spreading of paste material.

SUMMARY OF THE INVENTION

For example, a semiconductor device that includes a semiconductor chip having a power transistor formed therein is required to have excellent heat dissipation characteristics because a great amount of heat is generated from the semiconductor chip. Thus, in a semiconductor device that includes a semiconductor chip having a power transistor formed therein, the semiconductor chip is mounted on a chip mounting portion via solder having a higher thermal conductivity than paste material which contains metal powder. In the semiconductor device configured in this way, it is desired to suppress solder deterioration typified by the occurrence of cracking during a temperature cycling test.

Other problems and novel features will become apparent from the description of the present specification and the accompanying drawings.

A chip mounting portion in a semiconductor device in one embodiment has a first region that includes a semiconductor chip in plan view. In this case, when an average surface roughness of the first region is Ra, $0.8\ \mu m \leq Ra \leq 3.0\ \mu m$ holds.

According to the embodiment, it is possible to improve the reliability of the semiconductor device.

BRIEF DESCRIPTIONS OF THE DRAWINGS

DESCRIPTIONS OF THE PREFERRED EMBODIMENTS

Figure 1:
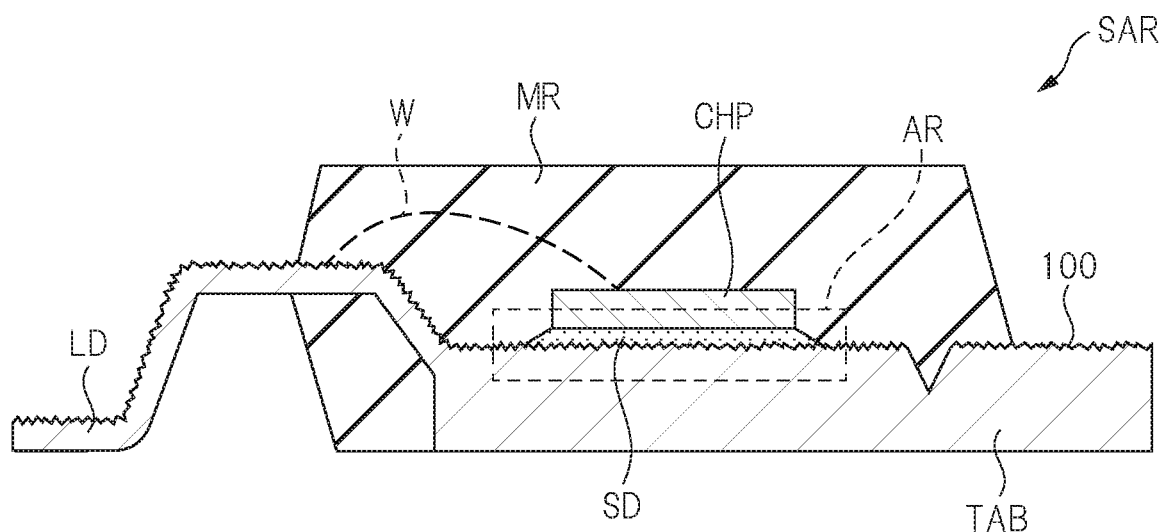
FIG. 1 is a schematic cross-sectional view illustrating a semiconductor device in a related art.

In the embodiment described below, the invention will be described in a plurality of sections or examples when required as a matter of convenience. However, these sections or examples are not irrelevant to each other unless otherwise stated, and the one relates to the entire or apart of the other as a modification example, details, or a supplementary explanation thereof.

Also, in the embodiment described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiment described below, it goes without saying that the components (including element steps) are not always indispensable unless otherwise stated or except the case where the components are apparently indispensable in principle.

Similarly, in the embodiment described below, when the shape of the components, positional relation thereof, and the like are mentioned, the substantially approximate and similar shapes and the like are included therein unless otherwise stated or except the case where it is conceivable that they are apparently excluded in principle. The same goes for the number and the range described above.

Also, components having the same function are denoted by the same reference characters throughout the drawings <Study of Improvements>

A study of improvements made by the inventors will be described first with reference to a related art.

The term "related art" mentioned in this specification means a technique having a problem newly found by the inventors and does not mean a known conventional art, but is a technique described with the intention for a background art of a novel technical idea (unknown art).

FIG. 1 a schematic cross-sectional view illustrating a semiconductor device in the related art. In FIG. 1, a semiconductor device SAR in the related art has a chip mounting portion TAB, which is integrally formed with a lead LD, and microscopic irregularities 100 are formed to extend from a surface of the chip mounting portion TAB to a surface of the lead LD. For example, an average surface roughness of the microscopic irregularities 100 is less than 0.8 µm. This value is determined in view of the fact that a wire W is connected with the surface of the lead LD. Specifically, if the average surface roughness of the microscopic irregularities 100 becomes too large, it is difficult to connect the wire W to the surface of the lead LD. For this reason, the average surface roughness of the microscopic irregularities 100 formed to extend from the surface of the chip mounting portion TAB to the surface of the lead LD needs to be less than 0.8 µm.

The term "average surface roughness" mentioned in this specification means an arithmetic mean roughness Ra according to JISB0601:2013, and will be written as an average surface roughness. Note that the region in which the average surface roughness is measured is arbitrarily set as appropriate according to the sizes of the chip mounting portion TAB and the lead LD.

Next, as illustrated in FIG. 1, a semiconductor chip CHP is mounted via solder SD on the chip mounting portion TAB where the microscopic irregularities 100 have been formed. In the semiconductor chip CHP, for example, a power transistor is formed, and the semiconductor chip CHP having the power transistor formed therein and the lead LD are electrically connected to each other by the wire W. Further, a sealing body MR made of resin is formed to cover the semiconductor chip CHP in the semiconductor device SAR in the related art. In this way, the semiconductor device SAR in the related art is mounted and configured.

As illustrated in FIG. 1, the microscopic irregularities 100 having an average surface roughness of less than 0.8 µm are formed on the surface of the chip mounting portion TAB in the semiconductor device SAR in the related art in order to improve adhesion between the chip mounting portion TAB and the sealing body MR. To be specific, when the microscopic irregularities 100 are formed on the surface of the chip mounting portion TAB, the resin constituting the sealing body MR enters the inside of the microscopic irregularities 100, and a so-called "anchor effect" is produced, resulting in an improvement in adhesion between the chip mounting portion TAB and the sealing body MR.

However, the study made by the inventors has newly revealed that when the microscopic irregularities 100 are formed on the surface of the chip mounting portion TAB, cracking and delamination of the solder SD are likely to occur, while adhesion between the chip mounting portion TAB and the sealing body MR is improved.

Figure 2:
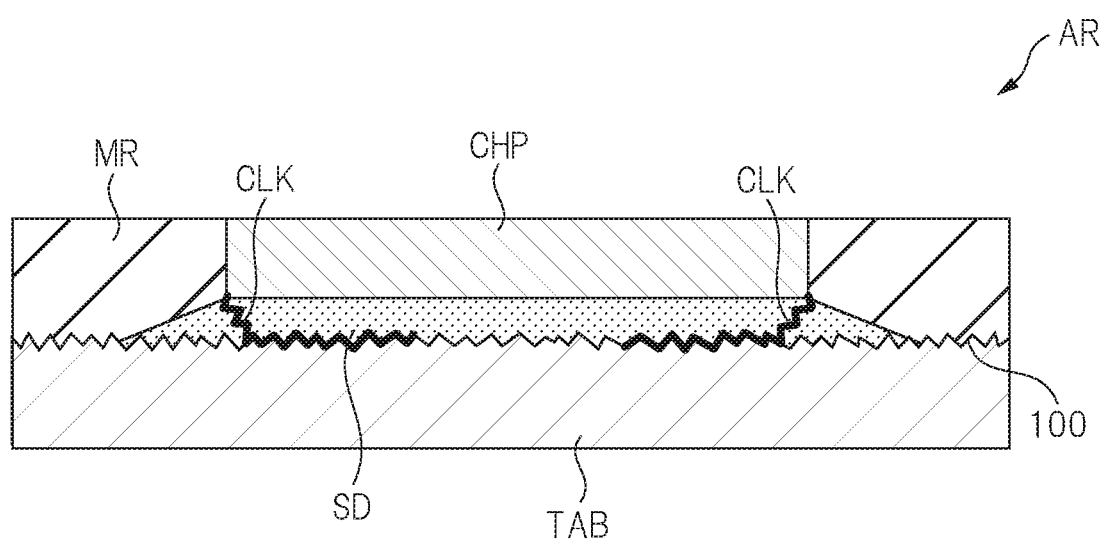
FIG. 2 is a diagram illustrating a region in FIG. 1 in an enlarged manner.

FIG. 2 is a diagram illustrating a region AR in FIG. 1 in an enlarged manner. FIG. 2 illustrates, for example, a state in which cracks CLK have occurred in the solder SD interposed between the chip mounting portion TAB and the semiconductor chip CHP. The term "cracks CLK" includes delamination at a bonding interface between the solder SD and the chip mounting portion TAB (hereinafter, description thereof will be omitted).

The cracks CLK in the solder SD presumably occur by the following mechanism.

In the related art, the microscopic irregularities 100 are formed on the surface of the chip mounting portion TAB in order to obtain the anchor effect. As a result, the adhesion between the chip mounting portion TAB and the sealing body MR can be increased in the related art. Accordingly, it is possible to suppress the delamination between the chip mounting portion TAB and the sealing body MR in the related art. However, the increased adhesion between the chip mounting portion TAB and the sealing body MR means that bending stress that is based on a difference in thermal expansion coefficient between the chip mounting portion TAB made of a copper alloy (metal) and the sealing body MR made of resin is less likely to be relaxed when, for example, a temperature cycling test is performed on the semiconductor device SAR. Specifically, as the adhesion between the chip mounting portion TAB and the sealing body MR increases, the stress applied to the solder SD increases. Hence, the formation of the microscopic irregularities 100 on the surface of the chip mounting portion TAB makes the cracks CLK more likely to occur in the solder SD when the temperature cycling test is performed on the semiconductor device SAR. Therefore, in the present embodiment, a contrivance is provided to suppress the occurrence of the cracks CLK in the solder SD interposed between the chip mounting portion TAB and the semiconductor chip CHP. Hereinafter, the technical idea of the present embodiment provided with this contrivance will be described.

<Configuration of Semiconductor Device>

Figure 3:
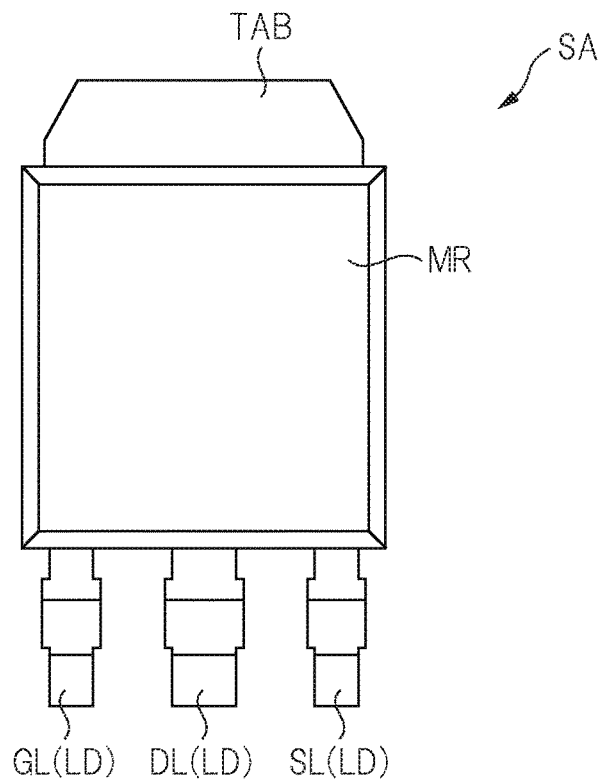
FIG. 3 is a top view illustrating an external configuration of a semiconductor device in an embodiment.
Figure 4:
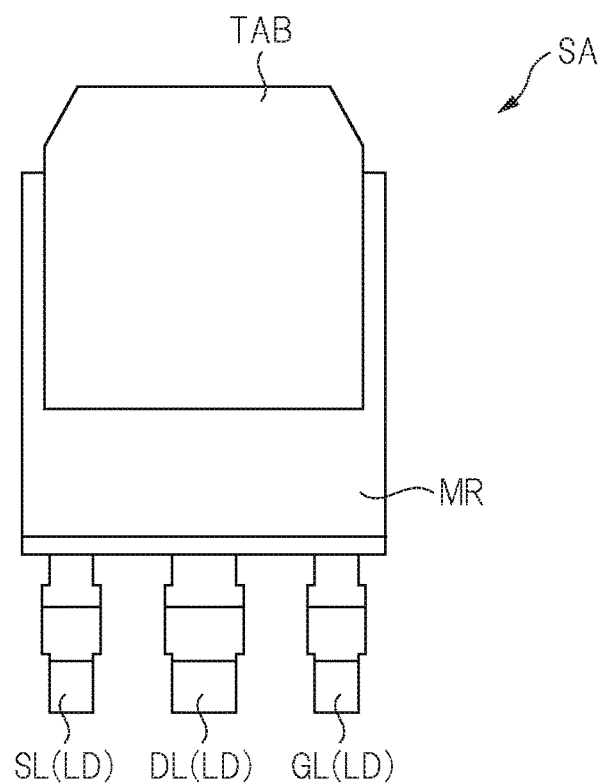
FIG. 4 is a bottom view illustrating the external configuration of the semiconductor device in the embodiment.
Figure 5:
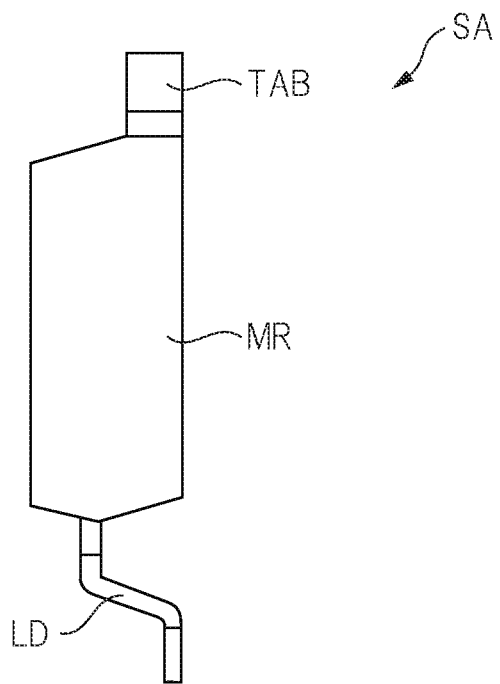
FIG. 5 is a side view illustrating the external configuration of the semiconductor device in the embodiment.

FIG. 3 is a top view illustrating an external configuration of a semiconductor device in the present embodiment. Also, FIG. 4 is a bottom view illustrating the external configuration of the semiconductor device in the present embodiment. Further, FIG. 5 is a side view illustrating the external configuration of the semiconductor device in the present embodiment. As illustrated in FIGS. 3 to 5, the semiconductor device SA in the present embodiment includes, for example, the sealing body MR which is substantially rectangular in a plane shape, and a part of the chip mounting portion TAB projects from one side surface of the sealing body MR. Similarly, a plurality of leads LD project from a side surface of the sealing body MR opposite to the one side surface. Specifically, the plurality of leads LD include a gate lead GL, a drain lead DL, and a source lead SL.

Figure 6:
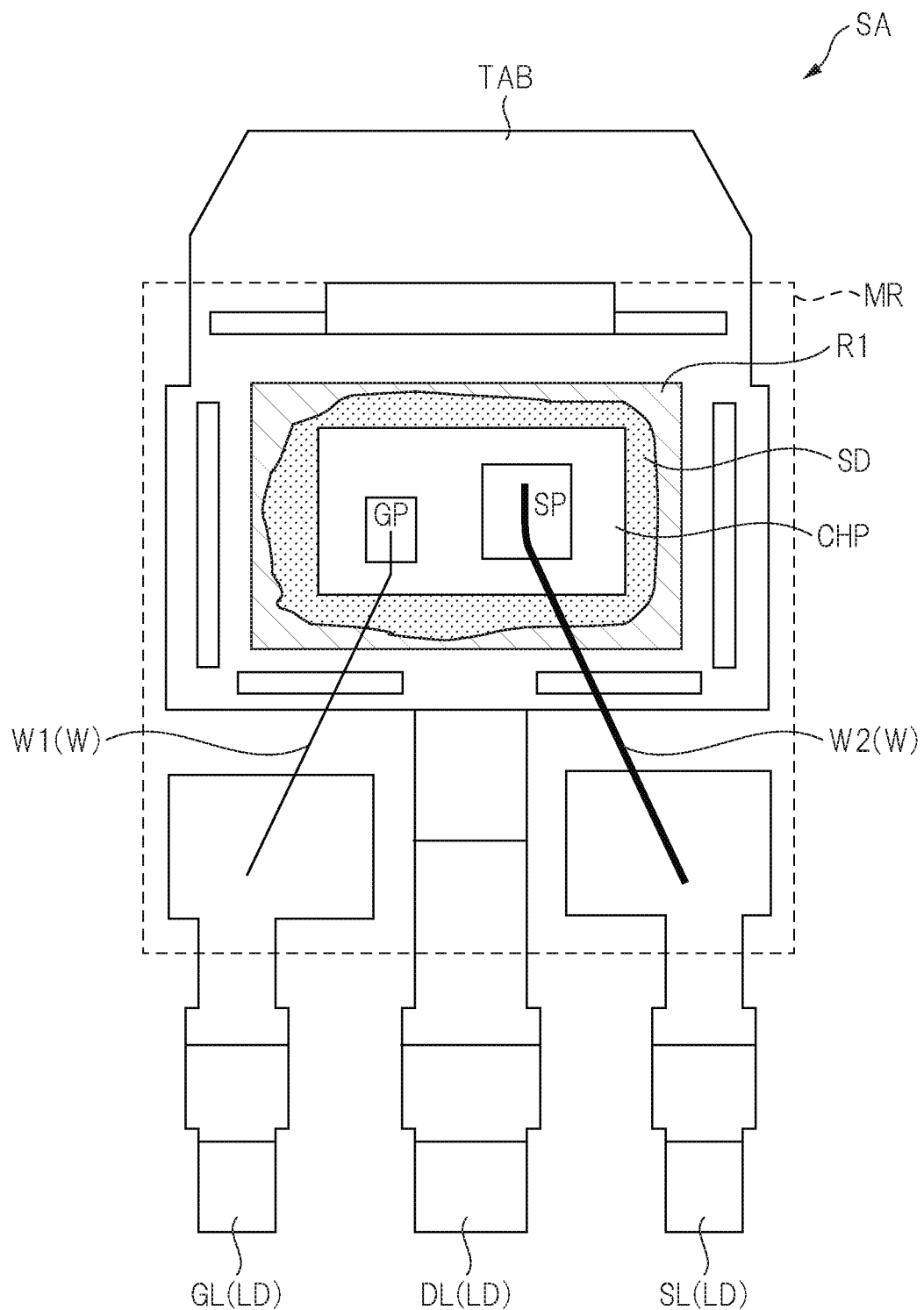
FIG. 6 is a diagram illustrating an internal configuration of the semiconductor device in the embodiment.

Next, FIG. 6 is a diagram illustrating an internal configuration of the semiconductor device in the present embodiment. In FIG. 6, the gate lead GL and the source lead SL are arranged such that the drain lead DL integrally formed with the chip mounting portion TAB is spaced apart from and sandwiched between the gate lead GL and the source lead SL. The chip mounting portion TAB has a region R1 including the semiconductor chip CHP in plan view, and the semiconductor chip CHP is mounted on the region R1 of the chip mounting portion TAB via solder SD. In this case, the solder SD in the present embodiment does not contain silica particles (silicon oxide particles) functioning as a volume-increasing material for ensuring the thickness of the solder SD.

In the semiconductor chip CHP, a power transistor is formed. At this time, when the power transistor is formed of, for example a power MOSFET, a gate pad GP which is electrically connected to a gate electrode of the power transistor and a source pad SP which is electrically connected to a source region of the power transistor are formed on a surface of the semiconductor chip CHP. Meanwhile, a back surface of the semiconductor chip CHP functions as a drain of the power transistor. However, the power transistor is not limited to be formed of a power MOSFET, but may be formed of an insulated gate bipolar transistor (IGBT). In this case, a gate pad which is electrically connected to a gate electrode of the IGBT and an emitter pad which is electrically connected to an emitter region of the IGBT are formed on the surface of the semiconductor chip CHP. Meanwhile, a back surface of the semiconductor chip CHP functions as a collector of the IGBT.

Subsequently, as illustrated in FIG. 6, the gate pad GP formed on the surface of the semiconductor chip CHP and the gate lead GL are connected by a wire W1. On the other hand, the source pad SP formed on the surface of the semiconductor chip CHP and the source lead SL are connected by a wire W2. In this configuration, a diameter of the wire W2 is greater than that of the wire W1. This is because large current flows between the source pad SP and the source lead SL and current flowing between the gate pad GP and the gate lead GL is smaller than the current flowing between the source pad SP and the source lead SL. Namely, since a main current of the power MOSFET flows between the source and the drain of the power MOSFET, the resistivity of the wire W2 needs to be lowered significantly.

Figure 7:
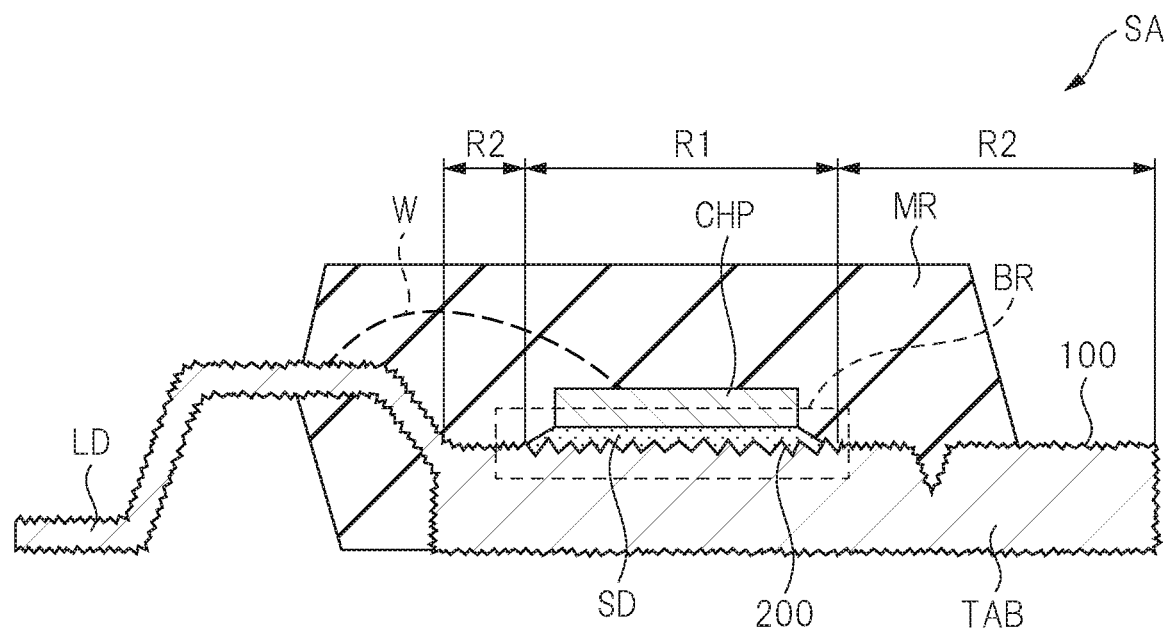
FIG. 7 is a cross-sectional view illustrating a schematic configuration of the semiconductor device in the embodiment.
Figure 8:
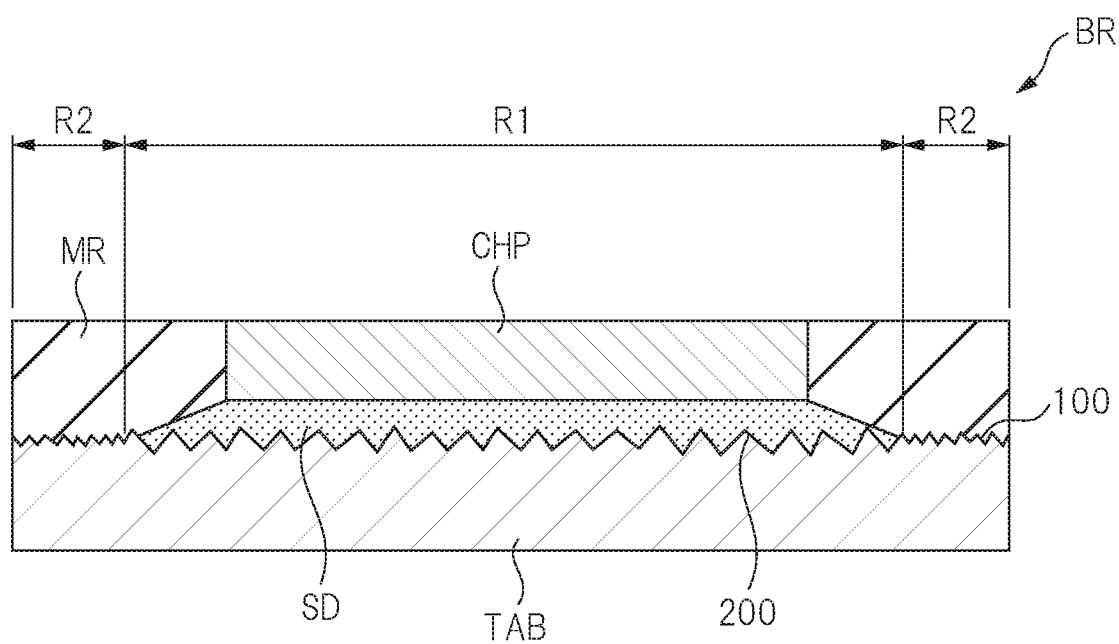
FIG. 8 is a diagram illustrating a region in FIG. 7 in an enlarged manner.

Next, FIG. 7 is a cross-sectional view illustrating a schematic configuration of the semiconductor device SA in the present embodiment. Also, FIG. 8 is a diagram illustrating a region BR in FIG. 7 in an enlarged manner. As illustrated in FIGS. 7 and 8, the semiconductor device SA in the present embodiment includes the chip mounting portion TAB and the semiconductor chip CHP mounted on the chip mounting portion TAB via the solder SD. In this case, the chip mounting portion TAB has the region R1 including the semiconductor chip CHP in plan view, and large irregularities 200 are formed on a surface of the region R1. Specifically, when an average surface roughness of the region R1 is Ra, 0.8 μm≤Ra≤3.0 μm holds.

On the other hand, the microscopic irregularities 100 are formed to extend from a surface of a peripheral region R2 of the chip mounting portion TAB, which surrounds the region R1 of the chip mounting portion TAB, to a surface of the lead LD. More specifically, an average surface roughness in this region is less than 0.8 μm.

Accordingly, the following configuration is realized in the semiconductor device SA in the present embodiment. To be specific, the semiconductor device SA in the present embodiment includes the leads LD that are spaced apart from the chip mounting portion TAB and the wires W that connect the semiconductor chip CHP to the leads LD. The leads LD have wire-connection regions that are connected to the wires W in plan view, and an average surface roughness of the region R1 is greater than that of the wire-connection regions.

Further, the following configuration is also realized in the semiconductor device SA in the present embodiment. Specifically, the chip mounting portion TAB has the region R1 and the peripheral region R2 surrounding the region R1, and the average surface roughness of the region R1 is greater than that of the peripheral region R2.

The solder SD interposed between the chip mounting portion TAB and the semiconductor chip CHP may be made of, for example, a high-melting point solder. This will be described below.

For example, after being completed as a product, the semiconductor device SA in the present embodiment is mounted on a circuit board (mounting board). At this time, solder is used to connect the semiconductor device SA to the mounting board. When the semiconductor device SA is connected to the mounting board with the solder, the solder is molten for the connection, and thus a heat treatment (reflow) is required.

Hence, if the solder used to connect the semiconductor device SA to the mounting board and the solder used inside the semiconductor device SA described above are made of the same material, the solder used inside the semiconductor device SA is also molten by the heat treatment (reflow) performed to connect the semiconductor device SA to the mounting board. This leads to problems such as occurrence of cracking in the resin (sealing body MR) that seals the semiconductor device SA due to volume expansion of the molten solder and leakage of the molten solder to the outside.

For this reason, a high-melting point solder is used inside the semiconductor device SA. In this case, the high-melting point solder used inside the semiconductor device SA is not molten by the heat treatment (reflow) performed to connect the semiconductor device SA to the mounting board. Consequently, it is possible to prevent the problems such as occurrence of cracking in the resin (sealing body) that seals the semiconductor device SA due to volume expansion of the molten high-melting point solder and leakage of the molten solder to the outside.

As the solder used to connect the semiconductor device SA to the mounting board, for example, a solder with a melting point of about 220° C., typically, Sn—Ag—Cu (tin-silver-copper) is used, and the semiconductor device SA is heated to about 260° C. during the reflow. Accordingly, the term "high-melting point solder" used in this specification is intended to mean a solder that does not melt even when it is heated to about 260° C. Typically, one example is a solder whose melting point is 300° C. or higher, whose reflow temperature is about 350° C., and which contains lead (Pb) in an amount equal to or greater than 90 wt %.

In this way, the semiconductor device SA in the present embodiment is configured.

Basic Idea in Embodiment

Next, the basic idea in the present embodiment will be described. The basic idea in the present embodiment is that the average surface roughness of the surface of the region R1 of the chip mounting portion TAB including the semiconductor chip CHP is made greater than that of the related art as illustrated in, for example, FIG. 7. In this way, according to the present embodiment, when a temperature cycling test is performed on the semiconductor device SA, occurrence of cracking in the solder SD can be suppressed. This will be described below.

For example, if the microscopic irregularities 100 are formed on the surface of the chip mounting portion TAB as in the related art illustrated in FIGS. 1 and 2, delamination between the chip mounting portion TAB and the sealing body MR can be suppressed by the anchor effect. On the other hand, if the microscopic irregularities 100 are formed on the surface of the chip mounting portion TAB, the fact that bending stress based on a difference in thermal expansion coefficient between the chip mounting portion TAB and the sealing body MR is less likely to be relaxed appears prominently as an adverse effect of the increase in adhesion between the chip mounting portion TAB and the sealing body MR. As a result, large stress is applied to the solder SD during a temperature cycling test, and large cracks occur in the solder SD. Consequently, the possibility of the delamination of the solder SD from the chip mounting portion TAB increases.

The basic idea in the present embodiment is that the average surface roughness of the surface of the region R1 of the chip mounting portion TAB including the semiconductor chip CHP is made greater than that of the related art. In this regard, considering the mechanism of the occurrence of cracking in the related art described above, there is concern that if the average surface roughness of the surface of the region R1 is increased further, the adhesion between the chip mounting portion TAB and the sealing body MR is increased by the anchor effect, so that large stress is applied to the solder SD during a temperature cycling test and cracking is more likely to occur in the solder SD. Namely, when the mechanism of the occurrence of cracking in the related art is taken into consideration, it may appear that the basic idea that the average surface roughness of the surface of the region R1 of the chip mounting portion TAB including the semiconductor chip CHP is made greater than that of the related art would produce an adverse effect in terms of suppressing the delamination of the solder SD from the chip mounting portion TAB caused by the occurrence of cracking in the solder SD.

In this respect, the inventors have found that when the average surface roughness of the surface of the region R1 of the chip mounting portion TAB including the semiconductor chip CHP is made greater than that of the related art, another mechanism described below appears prominently and the occurrence of cracking in the solder SD can be suppressed. Specifically, when the average surface roughness of the surface of the region R1 is made greater than that of the related art, the stress applied to the solder SD is dispersed by the large irregularities 200 formed on the surface of the region R1, so that crack growth in the solder SD is suppressed. Accordingly, when the average surface roughness of the surface of the region R1 is made greater than that of the related art, the effect of dispersing the stress resulting from the large irregularities 200 formed on the surface of the region R1 appears prominently, so that the delamination of the solder SD from the chip mounting portion TAB due to the cracking can be suppressed. As described above, when the average surface roughness of the surface of the region R1 is small, cracking is likely to occur in the solder SD, but when the average surface roughness of the surface of the region R1 is made greater, cracking is less likely to occur in the solder SD.

From the foregoing, according to the basic idea in the present embodiment that the average surface roughness of the surface of the region R1 of the chip mounting portion TAB including the semiconductor chip CHP is made greater than that of the related art, the delamination of the solder SD from the chip mounting portion TAB due to growth of cracks occurring in the solder SD can be suppressed. Namely, according to the basic idea in the present embodiment, thermal stress applied to the inside of the solder SD due to a difference in thermal expansion coefficient between the different constituent materials is dispersed by the randomness of the large irregularities formed on the surface of the region R1 of the chip mounting portion TAB, so that deterioration (such as cracking) of the solder SD caused by the temperature cycling test can be prevented. Therefore, according to the basic idea in the present embodiment, it is possible to provide the semiconductor device SA that has high heat resistance and thus high reliability even in severe use environments of the semiconductor device SA.

In this way, it can be seen that delamination of the solder SD from the chip mounting portion TAB due to occurrence of cracking in the solder SD can be qualitatively suppressed by the basic idea in the present embodiment that the average surface roughness of the surface of the region R1 of the chip mounting portion TAB including the semiconductor chip CHP is made greater than that of the related art.

In practice, however, it is unknown to what extent the average surface roughness of the surface of the region R1 of the chip mounting portion TAB including the semiconductor chip CHP should be made greater than that of the related art in order to make the stress dispersion effect appear prominently enough to suppress the delamination of the solder SD from the chip mounting portion TAB caused by the occurrence of cracking in the solder SD. Thus, the inventors have thought out a quantitative feature in the present embodiment on the basis of the basic idea in the present embodiment. The quantitative feature in the present embodiment will be described below.

Feature in Embodiment

As illustrated in FIG. 7, for example, the feature in the present embodiment is that when the average surface roughness of the surface of the region R1 of the chip mounting portion TAB including the semiconductor chip CHP is Ra, the relation $0.8\ \mu m \leq Ra \leq 3.0\ \mu m$ holds. Thus, according to the semiconductor device SA in the present embodiment, it is possible to effectively suppress the delamination of the solder SD from the chip mounting portion TAB caused by the occurrence of cracking in the solder SD.

To be specific, if the average surface roughness of the surface of the region R1 is less than the lower limit "$0.8\ \mu m$", the effect of dispersing the stress applied to the solder SD by the large irregularities 200 formed on the surface of the region R1 is less likely to appear prominently. For example, if the average surface roughness of the surface of the region R1 is less than the lower limit "$0.8\ \mu m$", a phenomenon in which a constituent material of the chip mounting portion TAB (heat dissipation plate) melts into the solder SD and a phenomenon in which such a constituent material is thermally diffused are more likely to occur. Consequently, the irregularities are flattened and the stress dispersion effect in the direction of the interface between the chip mounting portion TAB and the solder SD is reduced. As a result, the delamination of the solder SD from the chip mounting portion TAB due to growth of cracks occurring in the solder SD cannot be suppressed effectively. For the reason described above, the lower limit of the average surface roughness of the surface of the region R1 is set to "$0.8\ \mu m$".

As described above, it can be said that the lower limit "$0.8\ \mu m$" of the average surface roughness of the surface of the region R1 has a technical meaning as a boundary value in determining whether the delamination of the solder SD from the chip mounting portion TAB due to growth of cracks occurring in the solder SD can be effectively suppressed by dispersing the stress applied to the solder SD by the large irregularities 200 formed on the surface of the region R1.

On the other hand, the upper limit of the average surface roughness of the surface of the region R1 is set to "$3.0\ \mu m$" for the following reason. First, qualitatively, it is considered that as the average surface roughness of the surface of the region R1 increases, the thickness of the solder SD formed on the surface of the region R1 increases. In this case, as the thickness of the solder SD increases, dissipation efficiency for the heat generated in the semiconductor chip CHP lowers. In particular, since the semiconductor chip CHP in which the power transistor is formed generates a large amount of heat, it is important to improve the heat dissipation efficiency from the semiconductor chip CHP. Accordingly, if the average surface roughness of the surface of the region R1 is made greater than necessary, the thickness of the solder SD formed on the surface of the region R1 excessively increases, so that the heat dissipation efficiency for heat generated from the semiconductor chip CHP lowers. As a result, the possibility of causing a malfunction of the semiconductor device SA increases, leading to reduced reliability of the semiconductor device.

As described above, if the average surface roughness of the surface of the region R1 exceeds the upper limit "3.0 µm", the reduction in the heat dissipation efficiency in the semiconductor device SA appears prominently. Therefore, in the present embodiment, while the effect of dispersing the stress applied to the solder SD by the large irregularities 200 formed on the surface of the region R1 is made to apparent prominently, thereby suppressing the delamination of the solder SD from the chip mounting portion TAB caused by growth of cracks occurring in the solder SD, the upper limit of the average surface roughness of the surface of the region R1 is set to "3.0 µm" in order to suppress the deterioration of the heat dissipation characteristics in the semiconductor device SA. Accordingly, it can be said that the value "3.0 µm" as the upper limit of the average surface roughness of the surface of the region R1 has a technical meaning as a boundary value in terms of achieving both the effect of dispersing the stress applied to the solder SD by the large irregularities 200 formed on the surface of the region R1 and the effect of suppressing the deterioration of the heat dissipation efficiency in the semiconductor device SA by limiting the thickness of the solder SD with an excellent balance.

Furthermore, there is also concern that an increase in the thickness of the solder SD formed on the surface of the region R1 would increase the electrical resistance of the solder SD itself, resulting in a higher on-resistance of the semiconductor device SA. Therefore, the technical meaning of the value "3.0 µm" as the upper limit of the average surface roughness of the surface of the region R1 lies not only in suppressing a reduction in the heat dissipation efficiency in the semiconductor device SA, but also in suppressing an increase in the on-resistance, that is, performance degradation of the semiconductor device SA.

The reason why it is possible to set the upper limit of the average surface roughness of the surface of the region R1 to "3.0 µm" is that the conductive adhesive material interposed between the chip mounting portion TAB and the semiconductor chip CHP is made of the solder SD. For example, it is conceivable that a silver paste made of resin that contains silver filler is used as the conductive adhesive material interposed between the chip mounting portion TAB and the semiconductor chip CHP, but such a silver paste has a lower thermal conductivity than the solder SD. Namely, since the solder SD having a higher thermal conductivity than a silver paste is used, the heat dissipation characteristics of the semiconductor device SA can be ensured even when the upper limit of the average surface roughness of the surface of the region R1 is set to "3.0 µm". In other words, when a silver paste is used as the conductive adhesive material interposed between the chip mounting portion TAB and the semiconductor chip CHP, it is difficult to set the upper limit of the average surface roughness of the surface of the region R1 to "3.0 µm" in terms of ensuring the heat dissipation characteristics of the semiconductor device SA. Specifically, the use of the solder SD as the conductive adhesive material interposed between the chip mounting portion TAB and the semiconductor chip CHP is a prerequisite for the feature in the present embodiment that when the average surface roughness of the surface of the region R1 of the chip mounting portion TAB including the semiconductor chip CHP is Ra, the relation 0.8 µm≤Ra≤3.0 µm holds. Namely, the upper limit "3.0 µm" of the average surface roughness of the surface of the region R1 has a technical meaning as a boundary value in achieving the effect of suppressing the growth of cracks by dispersing the stress, while ensuring the heat dissipation characteristics of the semiconductor device SA, when the solder SD having a high thermal conductivity is used as the conductive adhesive material interposed between the chip mounting portion TAB and the semiconductor chip CHP.

From the foregoing, according to the feature in the present embodiment, while suppressing the deterioration of the heat dissipation characteristics of the semiconductor device SA due to the increased thickness of the solder SD, the delamination of the solder SD from the chip mounting portion TAB can be suppressed by the large irregularities 200 formed on the surface of the region R1.

The feature in the present embodiment that when the average surface roughness of the surface of the region R1 of the chip mounting portion TAB including the semiconductor chip CHP is Ra, the relation 0.8 µm≤Ra≤3.0 µm holds has the following secondary technical meaning, in addition to the technical meaning in achieving the effect of suppressing the growth of cracks by the dispersing the stress, while suppressing the deterioration of the heat dissipation characteristics of the semiconductor device SA due to the increased thickness of the solder SD.

For example, if the average surface roughness of the surface of the region R1 of the chip mounting portion TAB including the semiconductor chip CHP is less than 0.8 µm as in the related art, silica particles functioning as a volume-increasing material need to be mixed in the solder SD in order to ensure a certain thickness of the solder SD. Specifically, if the average surface roughness of the surface of the region R1 of the chip mounting portion TAB including the semiconductor chip CHP is less than 0.8 µm as in the related art, the thickness of the solder SD cannot be ensured without mixing a volume-increasing material in the solder SD. Also, if the solder SD does not have a thickness of a certain extent, the delamination of the solder SD from the chip mounting portion TAB is more likely to occur. Namely, the solder SD having a certain thickness is needed in order to suppress the delamination of the solder SD from the chip mounting portion TAB.

In this respect, when the feature in the present embodiment is adopted, the average surface roughness of the surface of the region R1 of the chip mounting portion TAB including the semiconductor chip CHP is made greater than that of the related art. Then, when the configuration in which the average surface roughness of the surface of the region R1 of the chip mounting portion TAB including the semiconductor chip CHP is made greater is adopted, the thickness of the solder SD inevitably increases. Specifically, when the average surface roughness of the surface of the region R1 of the chip mounting portion TAB including the semiconductor chip CHP is Ra, if the average surface roughness is increased to the extent that the relation 0.8 µm≤Ra≤3.0 µm holds, the thickness of the solder SD is naturally ensured by the volume-increasing effect by the surface having the increased average surface roughness, without the need to mix silica particles functioning as a volume-increasing material in the solder SD. Accordingly, when the feature in the present embodiment is adopted, a certain thickness of the solder SD can be ensured without mixing silica particles functioning as a volume-increasing material in the solder SD. This means that the manufacturing cost of the semiconductor device SA can be reduced because it is not necessary to mix silica particles in the solder SD. To be specific, the feature in the present embodiment has not only the technical meaning in achieving the effect of suppressing the growth of cracks, while suppressing the deterioration of the heat dissipation characteristics of the semiconductor device SA, but also the secondary technical meaning in reducing the manufacturing cost of the semiconductor device SA by eliminating the need for mixing silica particles functioning as a volume-increasing material in the solder SD. Therefore, according to the feature in the present embodiment, it is possible to achieve the beneficial effects of not only increasing the reliability of the semiconductor device SA, but also reducing the manufacturing cost of the semiconductor device SA.

For example, in FIG. 7, when the average surface roughness of the surface of the region R1 of the chip mounting portion TAB including the semiconductor chip CHP is Ra, the large irregularities 200 are formed on the surface of region R1 such that the relation $0.8~\mu m \leq Ra \leq 3.0~\mu m$ holds. On the other hand, in FIG. 7, the microscopic irregularities 100 for providing the average surface roughness of less than 0.8 μm are formed on the surface of the peripheral region R2 surrounding the perimeter of the region R1 and on the surfaces of the leads LD.

In this case, it is conceivable that the large irregularities 200 are formed not only in the region R1 but also on the surfaces of the leads LD such that the relation $0.8~\mu m \leq Ra \leq 3.0~\mu m$ holds. However, if the large irregularities 200 are also formed on the surfaces of the leads LD, the average surface roughness of the surfaces of the wire-connection regions where the leads LD and the wires W are connected also increases, so that the wires W are delaminated from the leads LD. Specifically, if the large irregularities 200 are also formed on the surfaces of the leads LD, the average surface roughness in the wire-connection regions increases as well, which makes it difficult to ensure the reliability of the connection between the leads LD and the wires W in the wire-connection regions. For this reason, in the present embodiment, for example, only the microscopic irregularities 100 for providing an average surface roughness of less than 0.8 μm are formed on the surfaces of the leads LD, instead of forming the large irregularities 200 by which the relation $0.8~\mu m \leq Ra \leq 3.0~\mu m$ holds as illustrated in FIG. 7. As a result, according to the semiconductor device SA in the present embodiment, the configuration in which the average surface roughness of the region R1 is greater than the average surface roughness of the wire-connection regions is achieved.

Meanwhile, as illustrated in FIG. 7, the microscopic irregularities 100 for providing an average surface roughness of less than 0.8 μm are formed on the surface of the peripheral region R2 surrounding the perimeter of the region R1. However, it is also possible to form the large irregularities 200 on the surface of the peripheral region R2 surrounding the perimeter of the region R1 such that the relation $0.8~\mu m \leq Ra \leq 3.0~\mu m$ holds on the surface of the peripheral region R2. Specifically, although the large irregularities 200 by which the relation $0.8~\mu m \leq Ra \leq 3.0~\mu m$ holds need to be formed at least in the region R1 in the present embodiment, the technical idea in the present embodiment is not limited to this configuration, but the large irregularities 200 by which the relation $0.8~\mu m \leq Ra \leq 3.0~\mu m$ holds may be formed in the entire surface of the chip mounting portion TAB including the region R1 and the peripheral region R2.

<Method for Manufacturing Semiconductor Device>

Next, a method for manufacturing the semiconductor device in the present embodiment will be described with reference to the drawings. The method for manufacturing the semiconductor device in the present embodiment will be first described in brief outline, and then in detail.

<<Outline of Manufacturing Method>>

Figure 9:
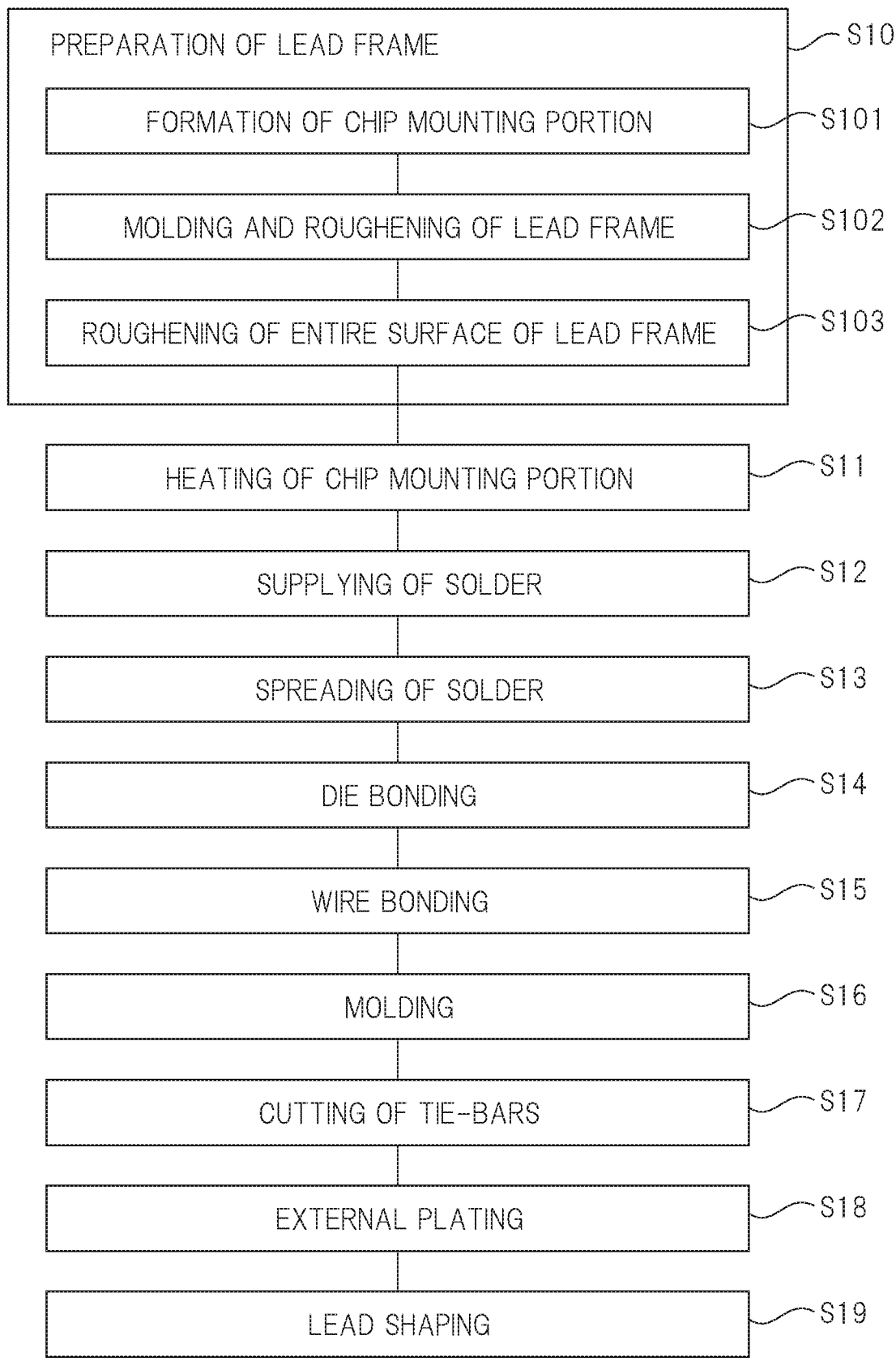
FIG. 9 is a flowchart illustrating a method for manufacturing the semiconductor device in the embodiment.

FIG. 9 is a flowchart illustrating a flow of the method for manufacturing the semiconductor device in the present embodiment. In FIG. 9, a lead frame is prepared first (S10). To be specific, in the step of preparing the lead frame, a step of forming a chip mounting portion (S101), a step of molding and roughening the lead frame (S102), and a step of roughening entire surface of the lead frame (S103) are performed, and the lead frame that has undergone these steps is prepared.

Next, after the chip mounting portion is heated (S11), solder is supplied to a surface of the heated chip mounting portion, and the supplied solder is molten by making contact with the heated chip mounting portion (S12). Thereafter, the molten solder is spread by using, for example, a spanker (S13).

Subsequently, after a semiconductor chip is mounted on the chip mounting portion via the solder (S14), the semiconductor chip and leads are connected by wires (S15). Then, after a sealing body made of resin is formed so as to cover the semiconductor chip (S16), tie-bars existing in the lead frame are cut (S17). Next, after a plating film is formed on surfaces of parts of the leads projecting from the sealing body (S18), the leads are shaped (S19). In this manner, the semiconductor device in the present embodiment can be manufactured.

<<Details of Manufacturing Method>>

The method for manufacturing the semiconductor device in the present embodiment will be described in detail with reference to the drawings.

Figure 10:
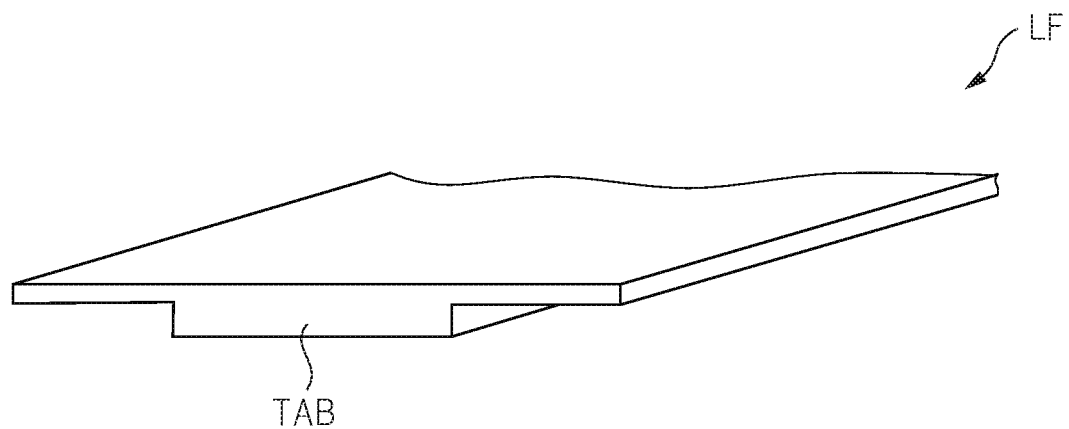
FIG. 10 is a diagram illustrating a manufacturing process of the semiconductor device in the embodiment.
Figure 11:
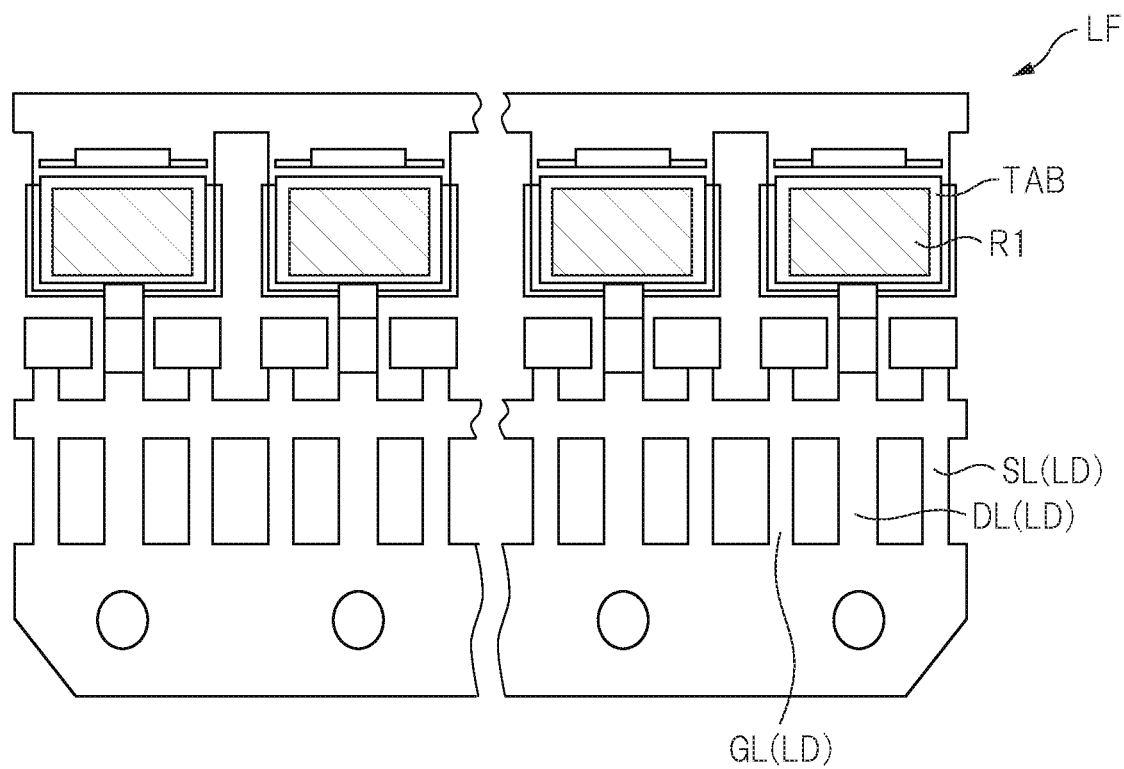
FIG. 11 is a diagram illustrating the manufacturing process of the semiconductor device, continued from FIG. 10.
Figure 12:
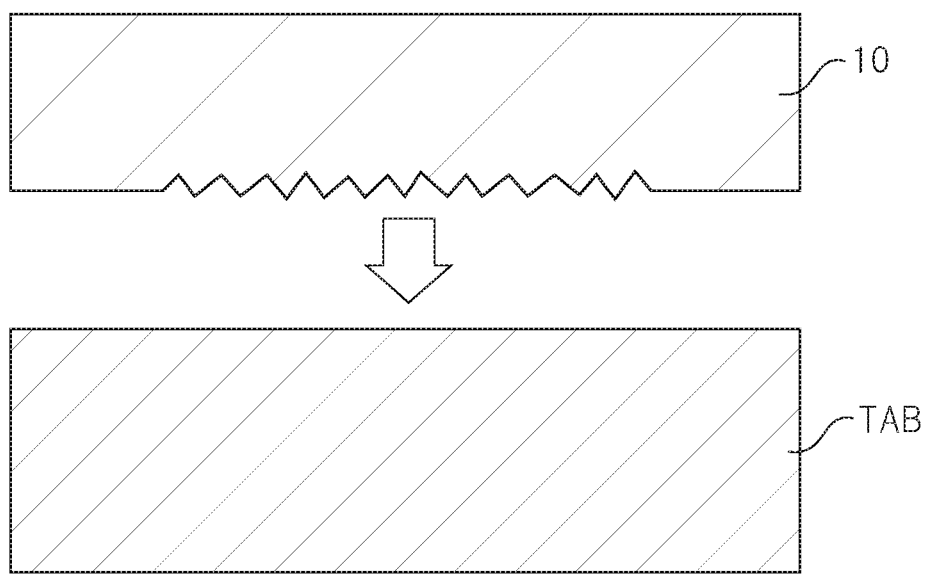
FIG. 12 is a diagram illustrating the manufacturing process of the semiconductor device, continued from FIG. 11.
Figure 13:
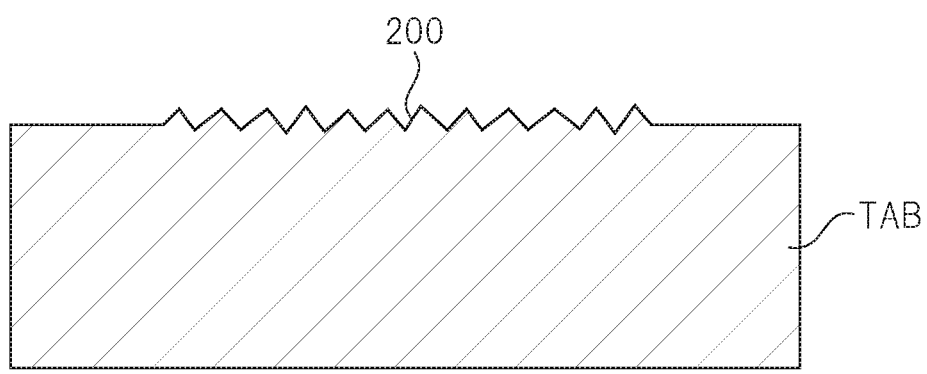
FIG. 13 is a diagram illustrating the manufacturing process of the semiconductor device, continued from FIG. 12.

The step of preparing a lead frame will be described first. As illustrated in FIG. 10, a lead frame LF including the chip mounting portion TAB of large thickness is molded. Next, as illustrated in FIG. 11, the lead frame LF is pressed to form the leads LD that include, for example, the gate leads GL, the drain leads DL, and the source leads SL. In this case, when the lead frame LF is pressed, the large irregularities 200 are formed in the region R1 (see FIG. 11) of each chip mounting portion TAB by a coining process using a punch 10 having irregularities formed thereon as illustrated in FIGS. 12 and 13.

Figure 14:
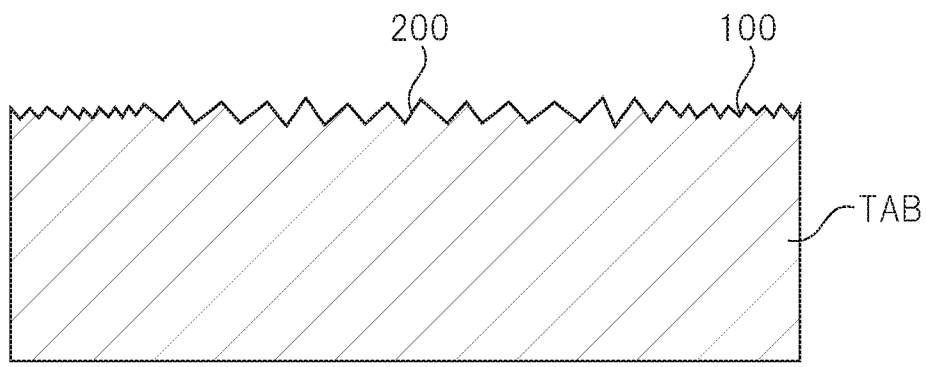
FIG. 14 is a diagram illustrating the manufacturing process of the semiconductor device, continued from FIG. 13.

Subsequently, as illustrated in FIG. 14, the microscopic irregularities 100 are formed on entire surface of the lead frame including the chip mounting portions TAB. The microscopic irregularities can be formed by, for example, a chemical polishing process or a roughening plating process. The average surface roughness of the microscopic irregularities 100 formed in this step is less than the average surface roughness of the large irregularities 200 formed by the coining process.

In this manner, the lead frame is prepared which includes the chip mounting portions TAB each having the region R1 where a semiconductor chip is internally mountable and the leads LD spaced apart from the chip mounting portions TAB, and in which the regions R1 have an average surface roughness of 0.8 μm or more and 3.0 μm or less and the average surface roughness of the regions R1 is greater than the average surface roughness of the leads LD.

Figure 15:
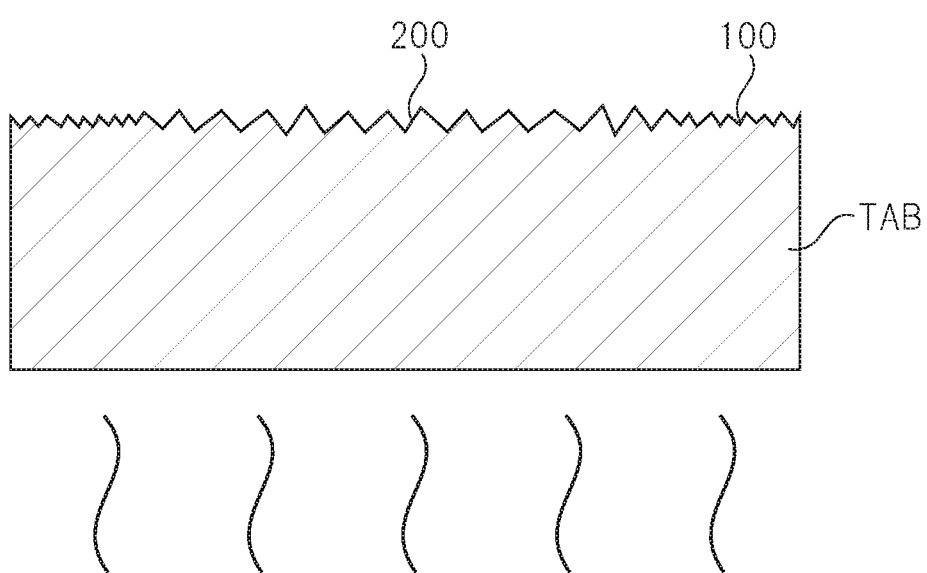
FIG. 15 is a diagram illustrating the manufacturing process of the semiconductor device, continued from FIG. 14.
Figure 16:
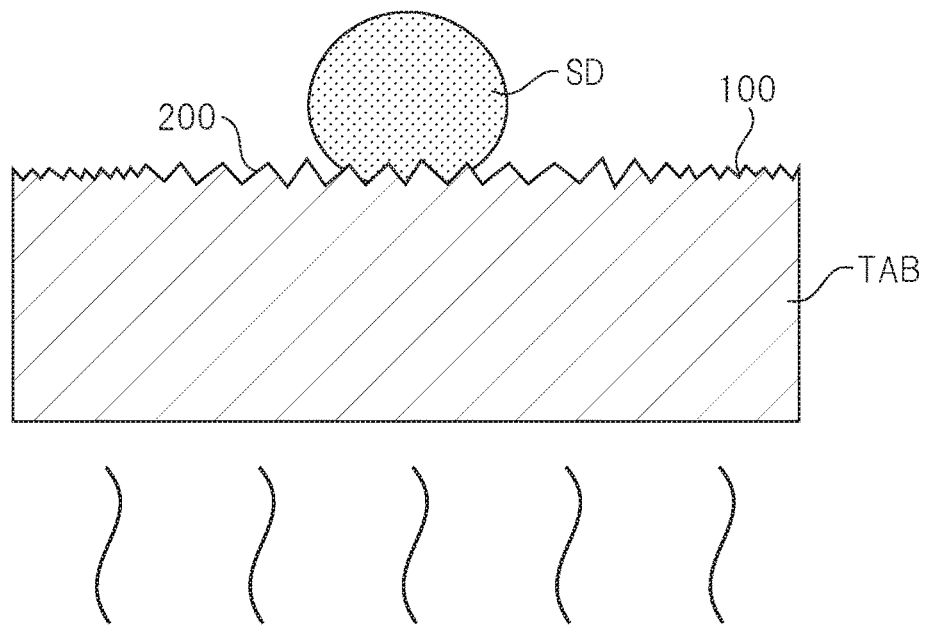
FIG. 16 is a diagram illustrating the manufacturing process of the semiconductor device, continued from FIG. 15.
Figure 17:
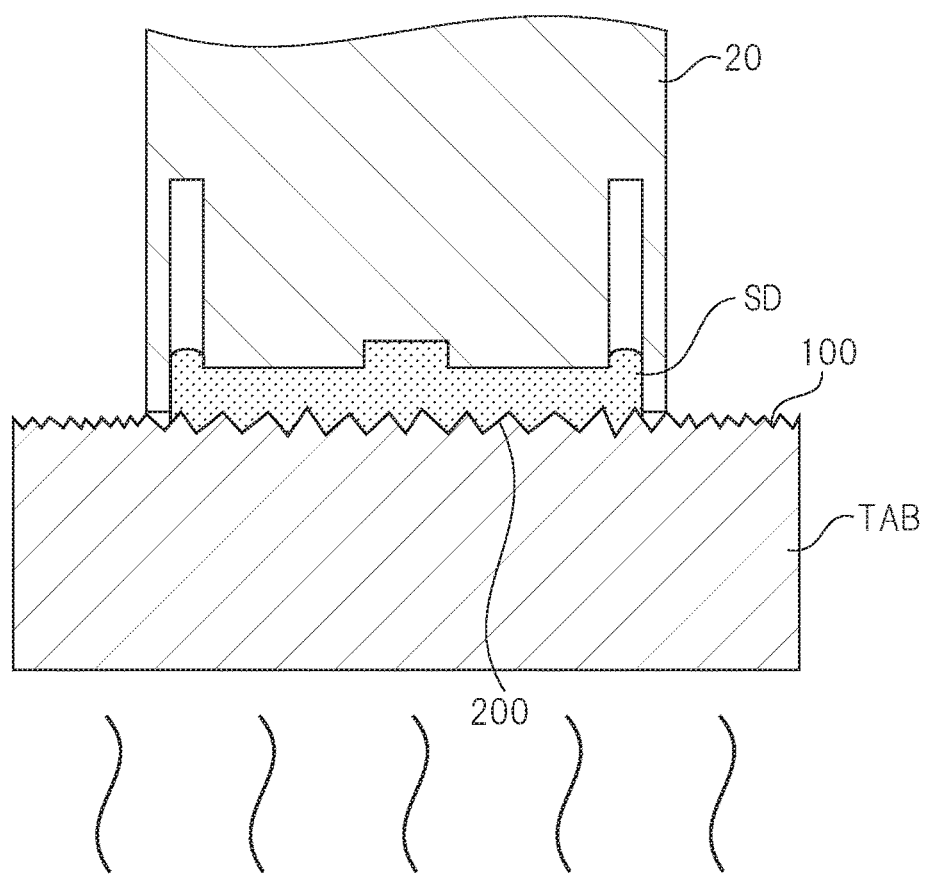
FIG. 17 is a diagram illustrating the manufacturing process of the semiconductor device, continued from FIG. 16.
Figure 18:
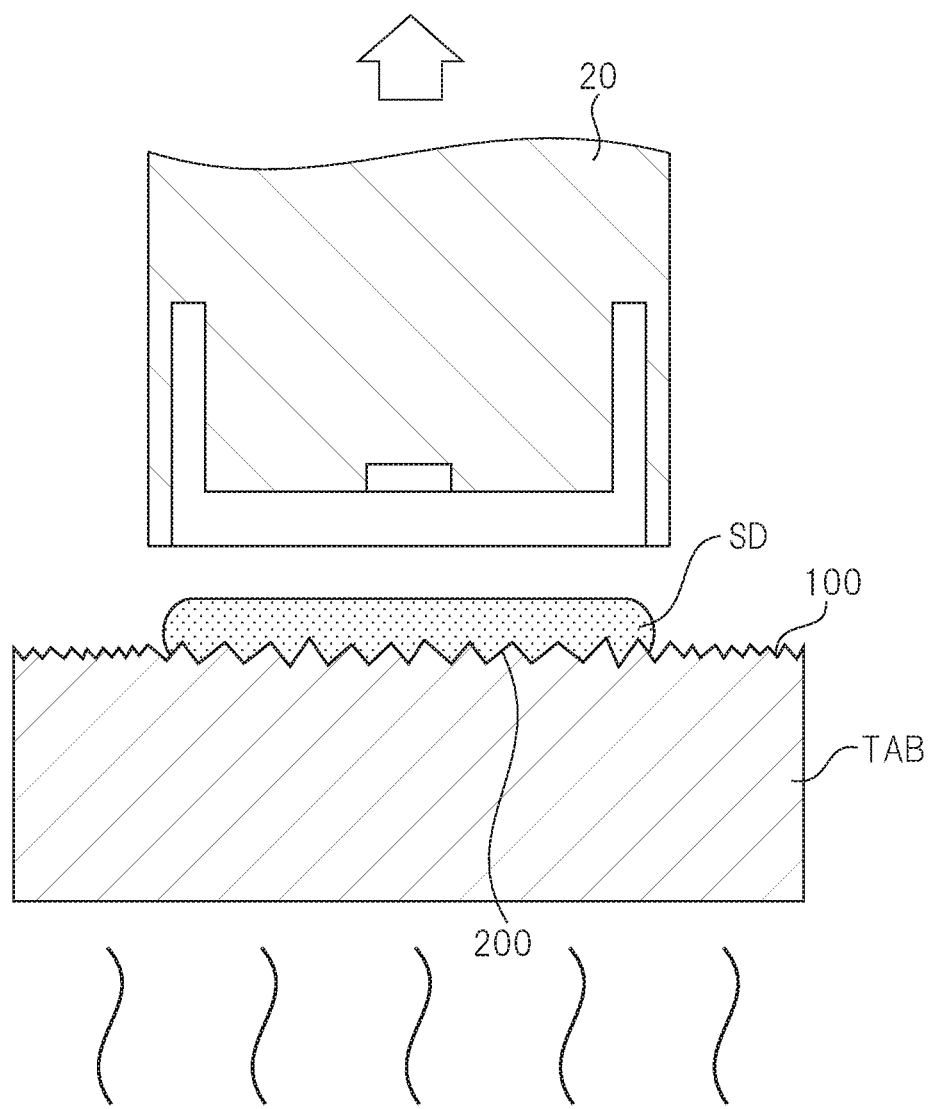
FIG. 18 is a diagram illustrating the manufacturing process of the semiconductor device, continued from FIG. 17.

Next, molten solder is formed on the regions R1 of the chip mounting portions TAB. Specifically, as illustrated in FIG. 15, each chip mounting portion TAB is first heated to a temperature of about 350° C. Then, as illustrated in FIG. 16, the solder SD made of a solder ribbon or a solder wire is supplied on the heated chip mounting portion TAB. At this time, the supplied solder SD is molten when making contact with the heated chip mounting portion TAB. Thereafter, as illustrated in FIG. 17, the molten solder SD is spread by using a spanker 20. Then, as illustrated in FIG. 18, the spanker 20 is moved upward, thereby forming the molten solder SD on the chip mounting portion TAB.

Figure 19:
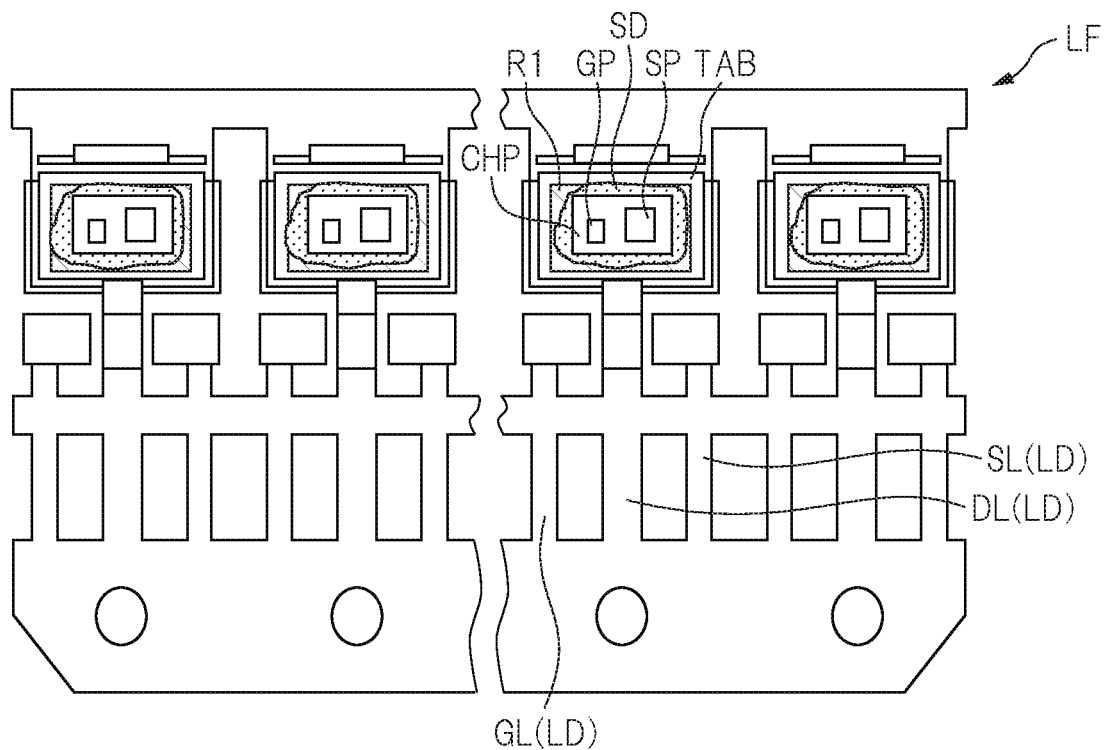
FIG. 19 is a diagram illustrating the manufacturing process of the semiconductor device, continued from FIG. 18.

Subsequently, as illustrated in FIG. 19, the semiconductor chip CHP is mounted on each chip mounting portion TAB via the molten solder SD. At this time, the semiconductor chip CHP includes a power MOSFET which is a type of power transistor formed therein, and the gate pad GP electrically connected to a gate electrode of the power MOSFET and the source pad SP electrically connected to a source region of the power MOSFET are formed on a surface of the semiconductor chip CHP.

Figure 20:
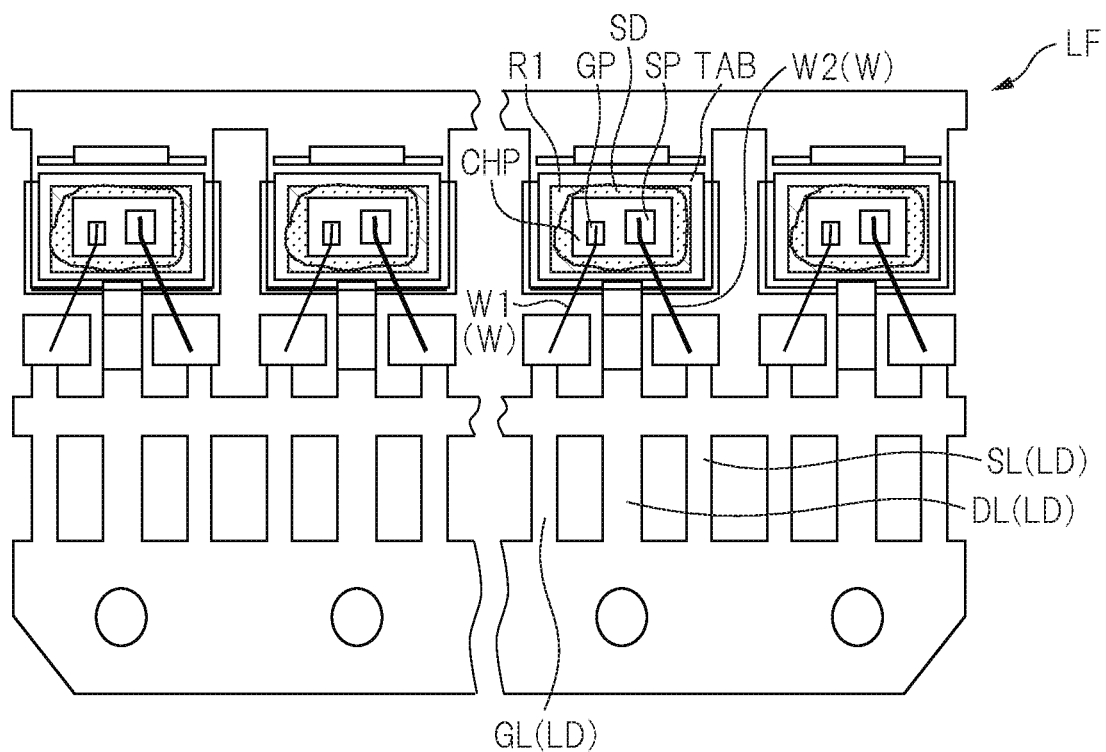
FIG. 20 is a diagram illustrating the manufacturing process of the semiconductor device, continued from FIG. 19.

Next, as illustrated in FIG. 20, the source pad SP formed on the surface of each semiconductor chip CHP is connected to the source lead SL formed in the lead frame LF by the wire W2, and the gate pad GP formed on the surface of each semiconductor chip CHP is connected to the gate lead GL formed in the lead frame LF by the wire W1.

Figure 21:
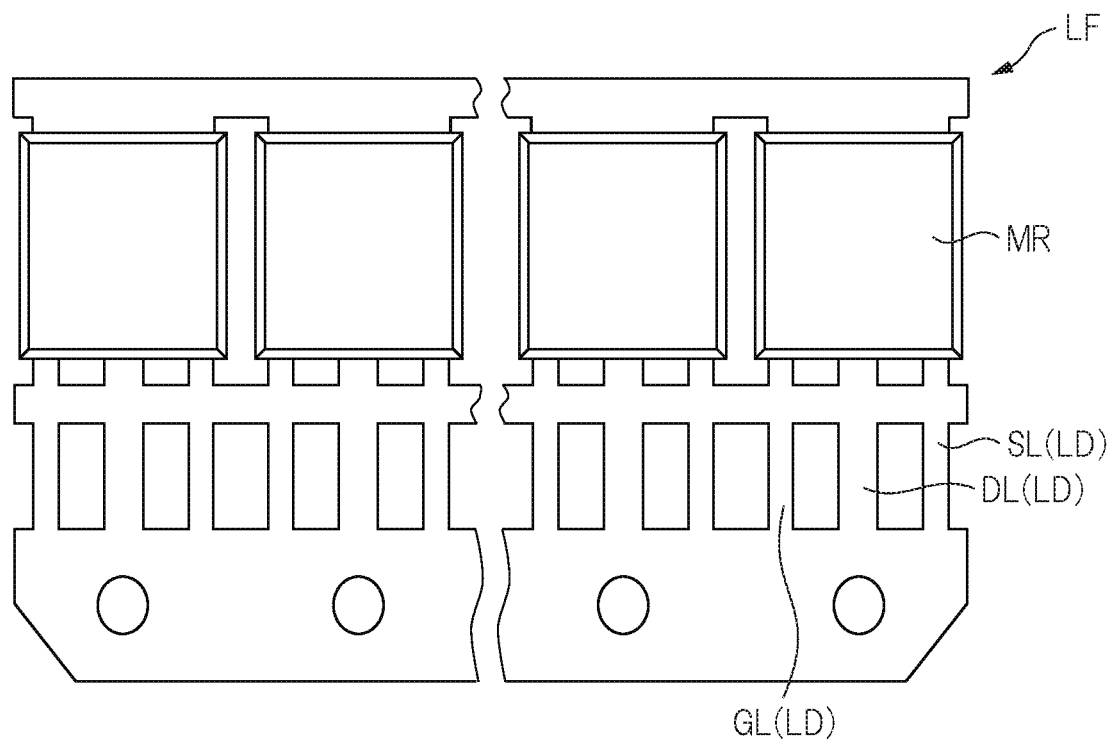
FIG. 21 is a diagram illustrating the manufacturing process of the semiconductor device, continued from FIG. 20.
Figure 22:
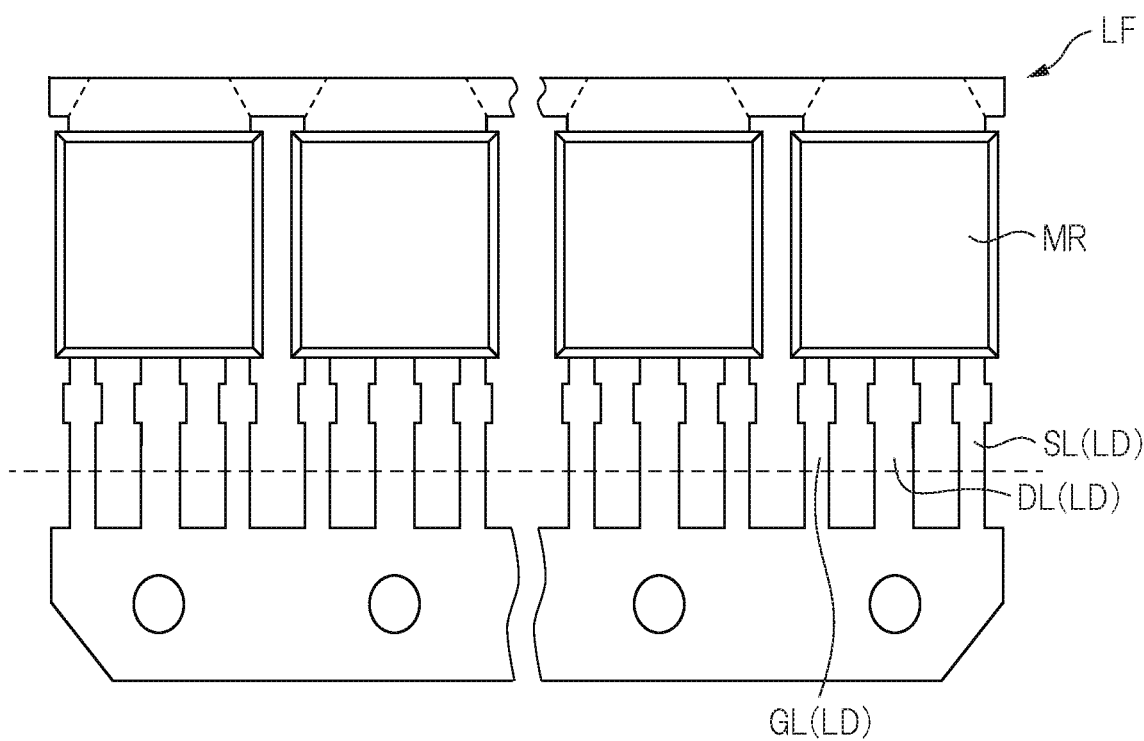
FIG. 22 is a diagram illustrating the manufacturing process of the semiconductor device, continued from FIG. 21.

Thereafter, as illustrated in FIG. 21, the sealing bodies MR made of resin are formed to cover the semiconductor chips. Then, for example, after tie-bars are cut, a plating film is formed on the surfaces of parts of the leads LD exposed from the sealing bodies MR. The sealing bodies MR are then separated into individual pieces, thereby manufacturing the semiconductor device in the present embodiment.

Features in Manufacturing Method in Embodiment

Next, features in the manufacturing method in the present embodiment will be described. A first feature in the manufacturing method in the present embodiment is that the large irregularities 200 having an average surface roughness of 0.8 µm or more and 3.0 µm or less are formed on the surface of the chip mounting portion TAB by the coining process using the punch 10 having irregularities as illustrated in, for example, FIGS. 12 and 13. With this feature, according to the present embodiment, the large irregularities 200 having an average surface roughness of 0.8 µm or more and 3.0 µm or less are formed on the surface of the chip mounting portion TAB by utilizing the step of molding the lead frame LF. For example, a stamping step is present in the step of molding the lead frame LF, and a punch is used to crush burrs generated in parts that have been stamped in the stamping step. Hence, the punch for crushing the burrs may be utilized to form the large irregularities 200 in the region R1 of the chip mounting portion TAB. As a result, according to the first feature in the manufacturing method in the present embodiment, there is no need to add a new step for forming the large irregularities 200 on the surface of the chip mounting portion TAB, so that it is possible to suppress the increase in the manufacturing cost of the semiconductor device SA. In this way, according to the first feature in the manufacturing method in the present embodiment, it is possible to achieve an excellent advantage of improving the reliability of the semiconductor device SA, while minimizing the increase in the product manufacturing cost.

In particular, the coining process is useful as a method for forming the large irregularities 200 having an average surface roughness of 0.8 µm or more and 3.0 µm or less on the surface of the chip mounting portion TAB. This is because although a sandblasting process, a chemical polishing process, and a roughening plating process which are examples of a method for forming irregularities can form microscopic irregularities, it is difficult to form the large irregularities 200 that have an average surface roughness of 0.8 µm or more and 3.0 µm or less by these processes. In addition, processes such as the sandblasting process, the chemical polishing process, and the roughening plating process require a masking process for covering regions other than the region in which the irregularities are formed. In contrast, the coining process adopted in the present embodiment needs no masking process. In this regard as well, the coining process which simplifies the step of forming the large irregularities 200 is useful.

In the present embodiment, for example, the large irregularities 200 need to be formed at least in the region R1, which is a region in the chip mounting portion TAB. However, the technical idea in the present embodiment is not limited to this configuration, but the large irregularities 200 may be formed in the entire surface of the chip mounting portion TAB including the region R1 and the peripheral region R2.

However, in terms of reducing the manufacturing cost, the large irregularities 200 by which the relation $0.8\ \mu m \leq Ra \leq 3.0\ \mu m$ holds are desirably formed only in the minimum required region, that is, the region R1 including the semiconductor chip CHP in plan view. This is because when the large irregularities 200 are formed on the entire surface of the chip mounting portion TAB including the region R1 and the peripheral region R2, a higher pressure needs to be applied to the punch 10 that is used in the coining process, and this means an increase in a total pressure in the entire molding step of the lead frame, so that the size of an apparatus for the entire molding step of the lead frame is increased.

Subsequently, a second feature in the manufacturing method in the present embodiment is that a contact surface area between the chip mounting portion TAB (the region R1) and the molten solder (the solder SD) is larger than a contact surface area between the spanker 20 and the molten solder (the solder SD) in the step of spreading the molten solder SD by using the spanker 20 as illustrated in, for example, FIGS. 17 and 18.

For example, if the contact area between the spanker 20 and the molten solder is larger than the contact area between the surface of the chip mounting portion TAB and the molten solder, so-called "dewetting" in which the molten solder SD sticks to the spanker 20 occurs at the time when the spanker 20 that has spread the molten solder SD is separated from the molten solder SD. If such "dewetting" occurs, the molten solder SD cannot be spread uniformly. Consequently, parts that are not wetted by the solder SD are likely to occur near corners (corner portions) of the semiconductor chip CHP mounted on the molten solder SD. As a result, gaps are formed in the parts that are not wetted by the solder SD between the semiconductor chip CHP and the chip mounting portion TAB, and the resin constituting the sealing body enters these gaps. In such a case, cracking and chipping are more likely to occur in the semiconductor chip CHP due to thermal stress generated during a temperature cycling test or in use environments of the semiconductor device SA, and this means that the reliability of the semiconductor device SA is reduced.

In this regard, in the present embodiment, the large irregularities 200 are formed on the surface of the chip mounting portion TAB as illustrated in, for example, FIG. 17. Accordingly, the contact surface area between the chip mounting portion TAB (the region R1) and the molten solder (the solder SD) is larger than the contact surface area between the spanker 20 and the molten solder (the solder SD) in the present embodiment. Therefore, as illustrated in FIG. 18, the molten solder SD that has spread on the surface of the chip mounting portion TAB remains on the surface without sticking to the separated spanker 20. Namely, according to the second feature in the manufacturing method in the present embodiment, the so-called "dewetting" is suppressed. Consequently, according to the present embodiment, the solder SD is uniformly spread on the semiconductor chip mounting region (the region R1) as required. This means that insufficient solder wetting is less likely to occur near the corners of the semiconductor chip CHP. As can be seen from the foregoing, according to the present embodiment, even when thermal stress is generated during a temperature cycling test or in use environments of the semiconductor device SA, cracking and chipping are less likely to occur in the semiconductor chip CHP, so that the reliability of the semiconductor device SA can be improved. Moreover, according to the present embodiment, since the supplied solder SD can be spread uniformly, the inclination of the semiconductor chip CHP mounted on the solder SD decreases, and the solder SD having a uniform thickness is achieved after die bonding. Consequently, according to the second feature in the manufacturing method in the present embodiment, it is possible to provide a semiconductor device in which not only wire bonding properties are improved, but also excellent resistance to temperature cycles is achieved with less deterioration of the solder SD.

In the foregoing, the invention made by the inventors of the present invention has been concretely described based on the embodiment. However, it is needless to say that the present invention is not limited to the foregoing embodiment and various modifications and alterations can be made within the scope of the present invention.

The embodiment described above includes the following modes.

APPENDIX

A method for manufacturing a semiconductor device, comprising the steps of:

(a) preparing a lead frame formed by performing, to the lead frame including a chip mounting portion having a first region in which a semiconductor chip is internally mountable and a lead spaced apart from the chip mounting portion, the steps of:

roughening a surface of the first region to a first average surface roughness; and roughening a surface of the lead frame to a second average surface roughness that is less than the first average surface roughness;

(b) forming molten solder on the first region; and (c) mounting the semiconductor chip on the first region via the molten solder.

What is claimed is:
1. A semiconductor device comprising:
a chip mounting portion having a main surface; and
a semiconductor chip mounted on the main surface of the chip mounting portion via solder, wherein the solder contains no silica particles,
wherein the semiconductor chip is disposed on a first region of the main surface of the chip mounting portion, and
wherein the first region of the main surface has an average surface roughness of 0.8 µm or more and 3.0 µm or less.

2. The semiconductor device according to claim 1, wherein the solder is a high-melting point solder.

3. The semiconductor device according to claim 1, wherein a power transistor is formed in the semiconductor chip.

4. The semiconductor device according to claim 1, further comprising:
a lead spaced apart from the chip mounting portion; and
a wire connecting the semiconductor chip to the lead,
wherein a surface of the lead has a wire-connection region connected to the wire in plan view, and
wherein the average surface roughness of the first region is greater than an average surface roughness of the wire-connection region.

5. A semiconductor device comprising:
a chip mounting portion having a main surface; and
a semiconductor chip mounted on the main surface of the chip mounting portion via solder,
wherein the semiconductor chip is disposed on a first region of the main surface of the chip mounting portion,
wherein the first region of the main surface has an average surface roughness of 0.8 µm or more and 3.0 µm or less,
wherein the main surface of the chip mounting portion includes:
the first region; and
a second region surrounding the first region, and
wherein the average surface roughness of the first region is greater than an average surface roughness of the second region.

6. A semiconductor device comprising:
a chip mounting portion having a main surface;
a semiconductor chip mounted on the main surface of the chip mounting portion via solder;
a lead spaced apart from the chip mounting portion and having one end portion and another end portion opposite one end portion which is arranged closer to the chip mounting potion than another end portion; and
a wire connecting the semiconductor chip to the lead,
wherein the semiconductor chip is disposed on a first region of the main surface of the chip mounting portion,
wherein one end portion of the lead has a surface connected to the wire in plan view, and
wherein an average surface roughness of the first region of the main surface of the chip mounting portion is greater than an average surface roughness of the surface of one end portion of the lead.

7. The semiconductor device according to claim 6, wherein the first region of the main surface has an average surface roughness of 0.8 µm or more and 3.0 µm or less.

8. The semiconductor device according to claim 7, wherein an average surface roughness of the end portion of the lead is less than 0.8 µm.

* * * * *